United States Patent
Qian

(10) Patent No.: US 10,392,462 B2
(45) Date of Patent: Aug. 27, 2019

(54) PHOTOSENSITIVE COMPOSITION CONTAINING OXIME-ESTER PHOTOINITIATOR AND APPLICATION THEREOF

(71) Applicants: Changzhou Tronly New Electronic Materials Co., Ltd., Jiangsu (CN); Changzhou Tronly Advanced Electronic Materials Co., Ltd., Jiangsu (CN)

(72) Inventor: Xiaochun Qian, Jiangsu (CN)

(73) Assignees: Changzhou Tronly Advanced Electronic Materials Co., Ltd., Jiangsu (CN); Changzhou Tronly New Electronic Materials Co., Ltd., Jiangsu (CN)

( * ) Notice: Subject to any disclaimer, the term of this patent is extended or adjusted under 35 U.S.C. 154(b) by 129 days.

(21) Appl. No.: 15/324,996

(22) PCT Filed: Jul. 9, 2015

(86) PCT No.: PCT/CN2015/083634
§ 371 (c)(1),
(2) Date: Jan. 9, 2017

(87) PCT Pub. No.: WO2016/008384
PCT Pub. Date: Jan. 21, 2016

(65) Prior Publication Data
US 2017/0210838 A1    Jul. 27, 2017

(30) Foreign Application Priority Data
Jul. 15, 2014    (CN) .......................... 2014 1 0334871

(51) Int. Cl.
| | |
|---|---|
| G03F 7/031 | (2006.01) |
| G02B 5/20 | (2006.01) |
| C08F 265/06 | (2006.01) |
| C08F 2/48 | (2006.01) |
| G03F 7/027 | (2006.01) |
| G02B 5/22 | (2006.01) |
| G03F 7/00 | (2006.01) |
| G03F 7/038 | (2006.01) |
| G03F 7/039 | (2006.01) |
| G03F 7/16 | (2006.01) |
| G03F 7/20 | (2006.01) |
| G03F 7/32 | (2006.01) |
| G03F 7/38 | (2006.01) |
| C08F 2/50 | (2006.01) |
| C09D 4/06 | (2006.01) |
| C08F 265/04 | (2006.01) |
| G03F 7/033 | (2006.01) |

(52) U.S. Cl.
CPC ............ *C08F 265/06* (2013.01); *C08F 2/48* (2013.01); *C08F 2/50* (2013.01); *C08F 265/04* (2013.01); *C09D 4/06* (2013.01); *G02B 5/223* (2013.01); *G03F 7/0007* (2013.01); *G03F 7/027* (2013.01); *G03F 7/031* (2013.01); *G03F 7/033* (2013.01); *G03F 7/038* (2013.01); *G03F 7/039* (2013.01); *G03F 7/162* (2013.01); *G03F 7/168* (2013.01); *G03F 7/2004* (2013.01); *G03F 7/322* (2013.01); *G03F 7/38* (2013.01)

(58) Field of Classification Search
CPC ........ G03F 7/0007; G03F 7/031; G03F 7/038; G03F 7/0388; G02B 5/223
USPC .............. 430/7, 281.1, 286.1, 287.1, 288.1
See application file for complete search history.

(56) References Cited

U.S. PATENT DOCUMENTS

2010/0188765 A1*  7/2010  Matsumoto .......... C07D 209/86
                                               359/891

FOREIGN PATENT DOCUMENTS

| CN | 1514845 | A | 7/2004 |
|---|---|---|---|
| CN | 102775527 | A | 11/2012 |
| CN | 103819583 | A | 5/2014 |
| CN | 103833872 | A | 6/2014 |
| CN | 104076606 | A | 10/2014 |
| JP | 2009/179619 | A | 8/2009 |
| JP | 2011/105713 | A | 6/2011 |

(Continued)

OTHER PUBLICATIONS

First Office Action issued to Chinese counterpart application No. 201410334871.1 by the Chinese Patent Office dated Feb. 3, 2017.

(Continued)

*Primary Examiner* — John A McPherson
(74) *Attorney, Agent, or Firm* — Cesari and McKenna, LLP

(57) ABSTRACT

Provided is a photosensitive composition containing an oxime-ester photoinitiator. The oxime-ester photoinitiator is a compound as shown in formula (I). The composition has the advantages of high curing speed, small exposure dose, less pollution, energy saving, almost no residue defect, etc., and the thickness, clarity and pattern integrity of a cured film thereof are all excellent.

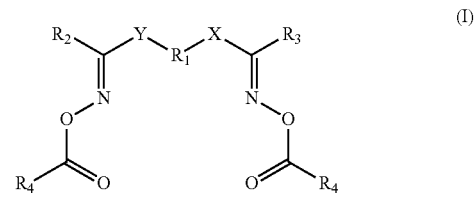

12 Claims, No Drawings

(56) References Cited

FOREIGN PATENT DOCUMENTS

JP          2012/048241  A     3/2012
WO     WO-2009/131189  A1    10/2009

OTHER PUBLICATIONS

Second Office Action issued to Chinese counterpart application No. 201410334871.1 by the Chinese Patent Office dated Jul. 13, 2017.
Notification of Reasons for Refusal issued to Japanese counterpart application No. 2017502252 by the Japanese Patent Office dated Dec. 25, 2017.
Notice of Preliminary Rejection issued to Korean counterpart application No. 10-2017-7003365 by the Korean Patent Office dated Mar. 28, 2018.

\* cited by examiner

PHOTOSENSITIVE COMPOSITION CONTAINING OXIME-ESTER PHOTOINITIATOR AND APPLICATION THEREOF

CROSS REFERENCE TO RELATED APPLICATIONS

This application is the National Stage of International Application No. PCT/CN2015/083634, filed on Jul. 9, 2015, which claims the benefit of Chinese Application No. 201410334871.7, filed on Jul. 15, 2014. The contents of both applications are hereby incorporated by reference in their entirety.

TECHNICAL FIELD

This invention belongs to the technical field of photocuring, and particularly to a photosensitive composition (i.e., a photocurable composition) containing an oxime ester photoinitiator and application thereof in a liquid crystal display apparatus, such as a color filter, a photospacer, or a rib.

BACKGROUND ART

In recent years, oxime ester photoinitiators have been gradually used in photosensitive compositions due to relatively excellent photosensitive property thereof. However, it has been found in applications that there are still many shortages in existing products, which typical problems include bad stability and poor solubility. Most of oxime ester photoinitiators, due to the restriction by the absorption wavelengths themselves, are not well fit for LED dot light sources and laser light sources, which attract increasing attentions in environmental protection. In colored systems such as dyes, etc., the photosensitivity, the developability, and the resolution effect are not good, and not only the production efficiency is reduced, but also the resultant products cannot achieve required precision and reliability.

Furthermore, with continuous development of science and technology, while proposing higher requirements for clarity and integrity of images shown by liquid crystal displays, the safety of the operational environment of workers and the control of hazardous substances in the process of production become stricter and stricter, and there are proposed higher requirements for utilization properties, particularly safety and environmental protection property, of photosensitive compositions.

Factors in various aspects are required to be considered in the development and the application of future photosensitive compositions. However, there are slight shortages in overall properties of existing products, which cannot satisfy increasingly urgent application requirements.

SUMMARY OF THE INVENTION

With respect to the shortages in the prior art, an object of this invention is to provide a photosensitive composition containing an oxime ester photoinitiator, which contains a compound of formula (I) as a photoinitiator and monomers and polymers adapted to the photoinitiator. This composition has the advantages of high curing speed, small exposure dose, low pollution, low energy consumption, few deficiencies of residues, etc. It is experimentally demonstrated that the thickness, the clarity, and the pattern integrity of the film formed thereby are all greatly superior to those of products of the same type.

In order to achieve the object described above, a technical solution used in this invention is as follows:

A photosensitive composition containing an oxime ester photoinitiator, comprising the following components:

(A) 20-60 parts by mass of an ultraviolet photosensitive prepolymer resin;

(B) 10-30 parts by mass of an active diluent monomer;

(C) 1-5 parts by mass of an oxime ester photoinitiator;

the oxime ester photoinitiator as component (C) being at least one selected from the group consisting of bisoxime ester compounds represented by the following general formula (I):

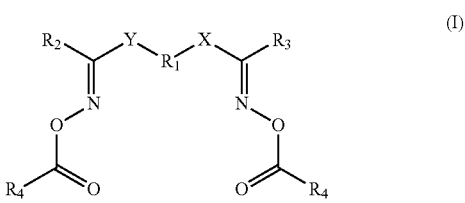

wherein,
$R_1$ is

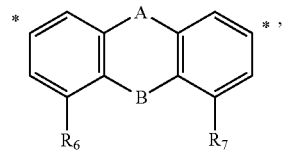

wherein * represents a binding position, A is blank (i.e., two benzene rings on the left and on the right are connected with each other only by B), a single bond, or a $C_1$-$C_5$ alkylene group; B is O, S, or a $R_5N$— group, wherein $R_5$ is hydrogen, a $C_1$-$C_{20}$ linear or branched alkyl group, a $C_3$-$C_{20}$ cycloalkyl group, a $C_4$-$C_{20}$ cycloalkylalkyl group, or a $C_4$-$C_{20}$ alkylcycloalkyl group; $R_6$ and $R_7$ each independently represent hydrogen, halogen, a nitro group, a hydroxy group, a carboxyl group, a sulfonic acid group, an amino group, a cyano group, or an alkoxy group, or a $C_1$-$C_{20}$ linear or branched alkyl group, a $C_3$-$C_{20}$ cycloalkyl group, a $C_4$-$C_{20}$ cycloalkylalkyl group, or a $C_4$-$C_{20}$ alkylcycloalkyl group which are optionally substituted with one or more groups selected from the group consisting of halogen, a nitro group, a hydroxy group, a carboxyl group, a sulfonic acid group, an amino group, a cyano group, and an alkoxy group;

X and Y each independently represent a carbonyl (—CO—) or a single bond;

$R_2$ and $R_3$ each independently represent hydrogen, a $C_1$-$C_{20}$ linear or branched alkyl group, a $C_3$-$C_{20}$ cycloalkyl group, a $C_4$-$C_{20}$ cycloalkylalkyl group, a $C_4$-$C_{20}$ alkylcycloalkyl group, or a $C_7$-$C_{20}$ aralkyl group, and optionally, one or more hydrogens in the above groups may be each independently substituted with a group selected from the group consisting of halogen, a nitro group, a hydroxy group, a carboxyl group, a sulfonic acid group, an amino group, a cyano group, and an alkoxy group;

$R_4$ independently represents a $C_1$-$C_{20}$ linear or branched alkyl group, a $C_3$-$C_{20}$ cycloalkyl group, a $C_4$-$C_{20}$ cycloalkylalkyl group, a $C_4$-$C_{20}$ alkylcycloalkyl group, a $C_3$-$C_{20}$ heteroaryl group, or a $C_6$-$C_{20}$ aryl group, and optionally, one or more hydrogens in the above groups may be each independently substituted with a group selected from the group consisting of halogen, a phenyl group, a nitro group, a hydroxy group, a carboxyl group, a sulfonic acid group, an amino group, a cyano group, and an alkoxy group.

The oxime ester photoinitiator as component (C) may be prepared by the following method:

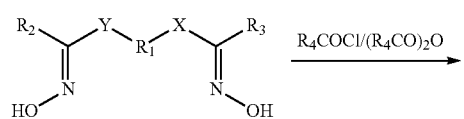 R₄COCl/(R₄CO)₂O →

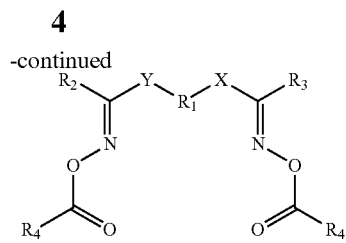

the oxime compound being reacted with the acid anhydride or the acid chloride to obtain the oxime ester photoinitiator.

As a preferable embodiment of this invention, in the photosensitive composition described above, the oxime ester photoinitiator as component (C) is one or a combination of two or more selected from the following structures:

Compound No. 1

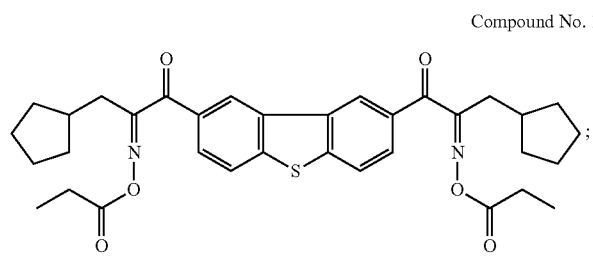

Compound No. 2

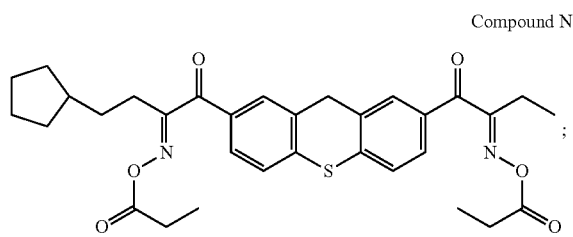

Compound No. 3

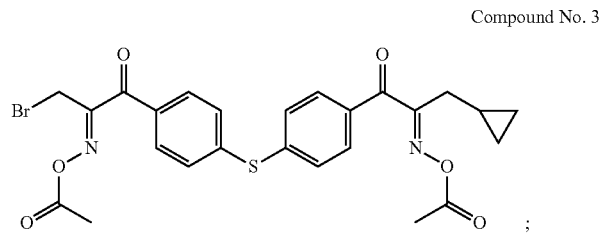

Compound No. 4

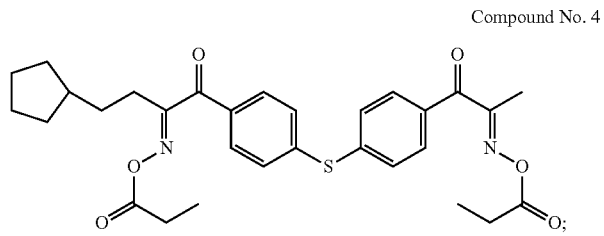

Compound No. 5

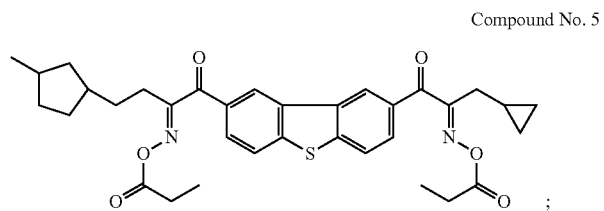

Compound No. 6

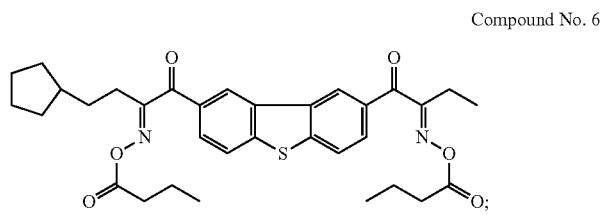

Compound No. 7

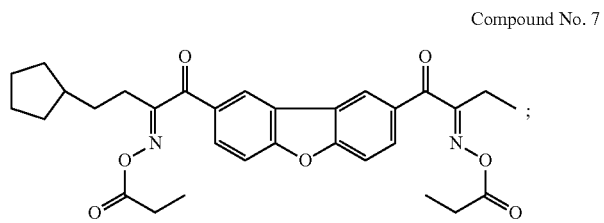

Compound No. 8

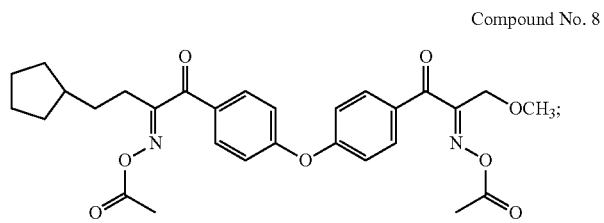

Compound No. 9

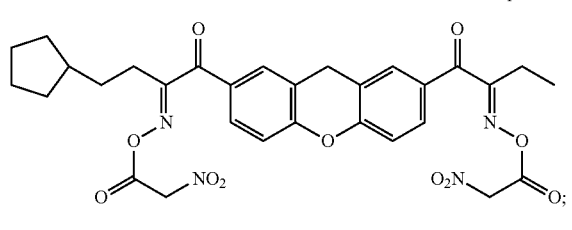

Compound No. 10

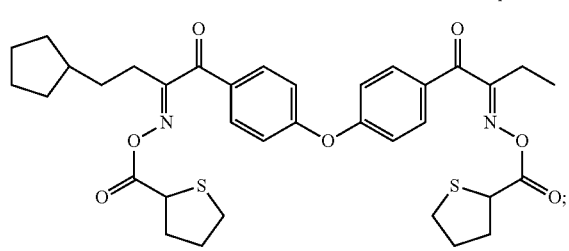

Compound No. 11
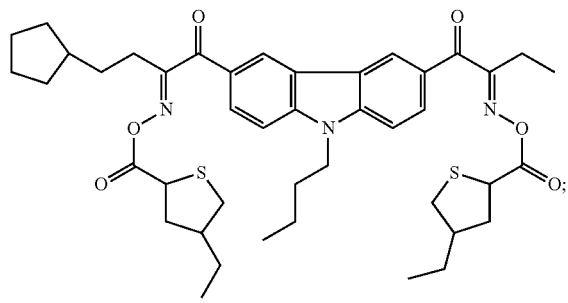
Compound No. 12
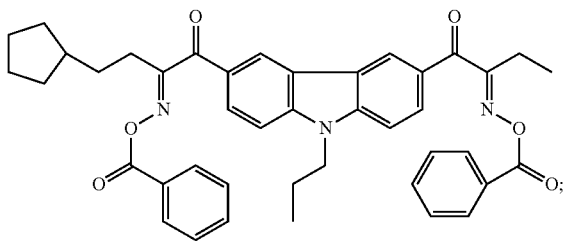
Compound No. 13
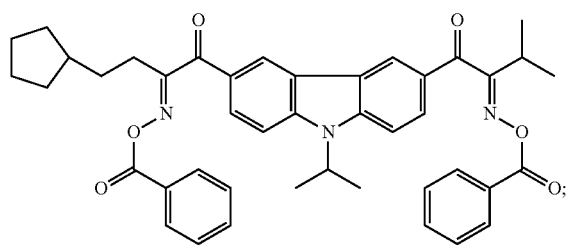
Compound No. 14
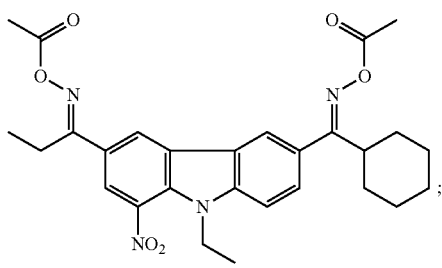
Compound No. 15
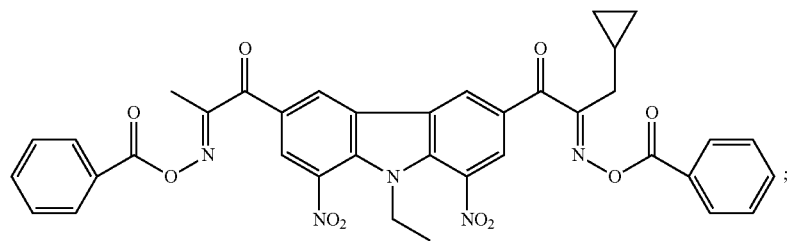
Compound No. 16
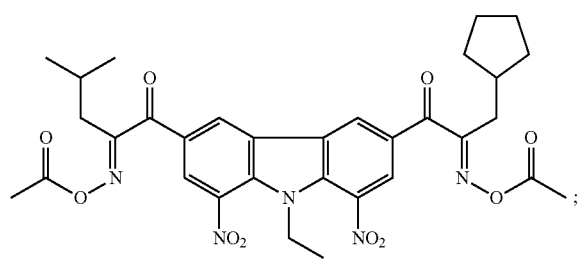
Compound No. 17
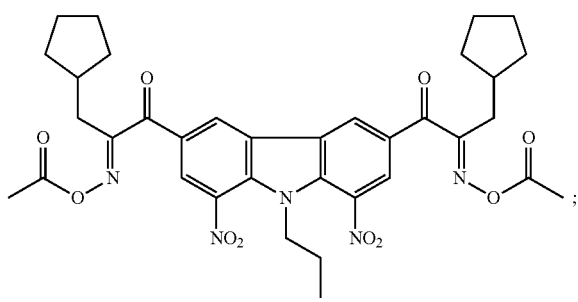
Compound No. 18
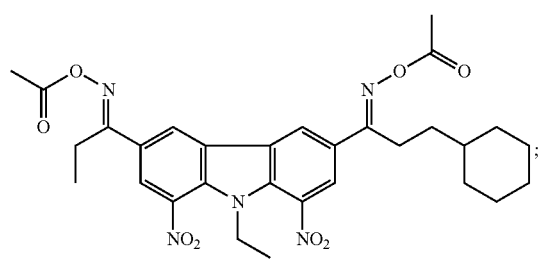
Compound No. 19
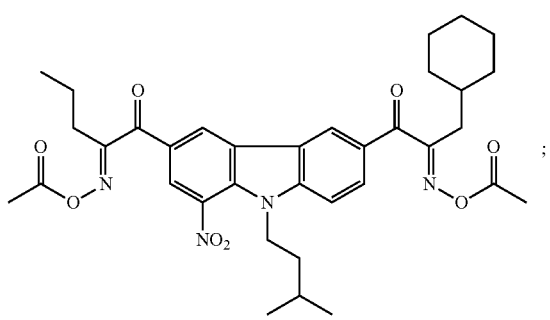

-continued
Compound No. 20
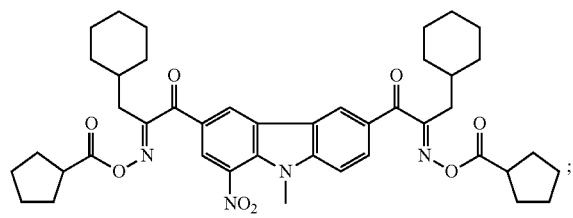
Compound No. 21
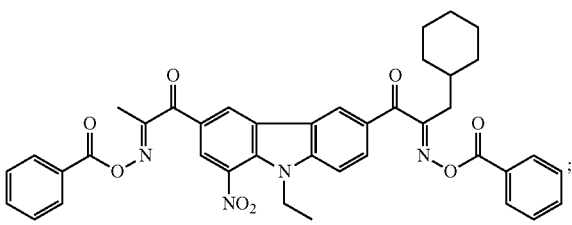
Compound No. 22
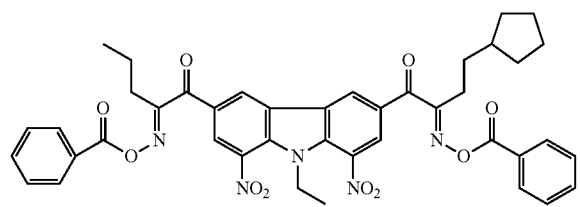
Compound No. 23
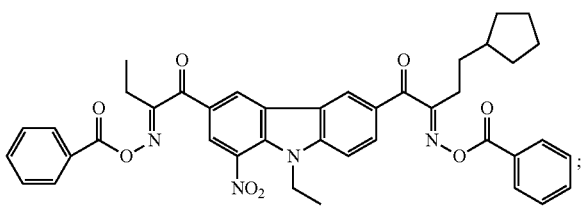
Compound No. 24
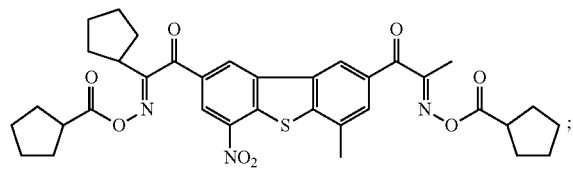
Compound No. 25
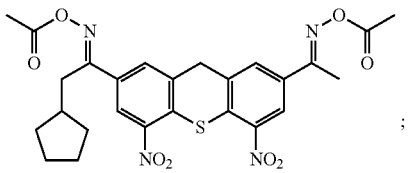
Compound No. 26
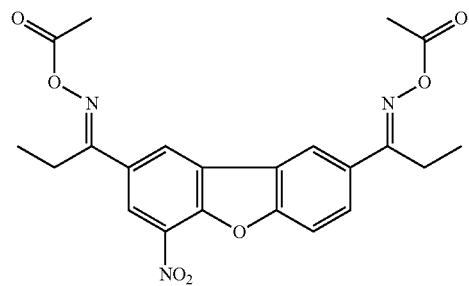
Compound No. 27
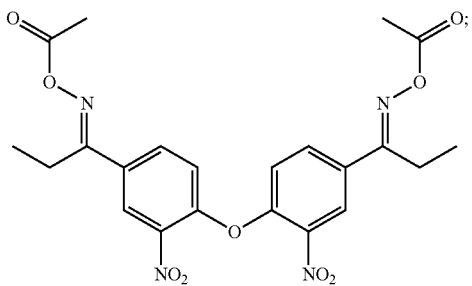
Compound No. 28
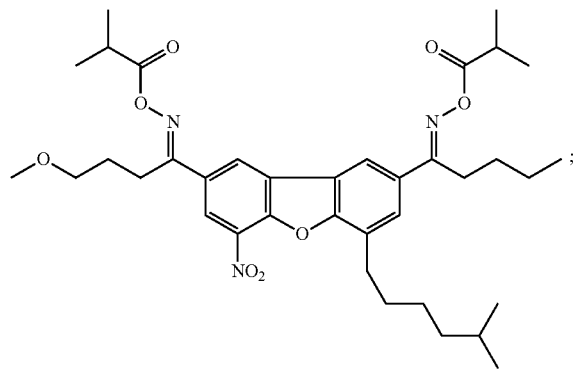
Compound No. 29
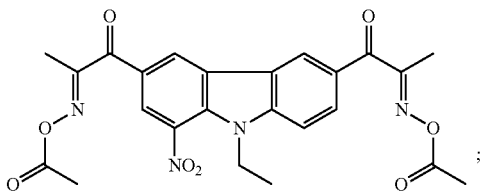

-continued
Compound No. 30
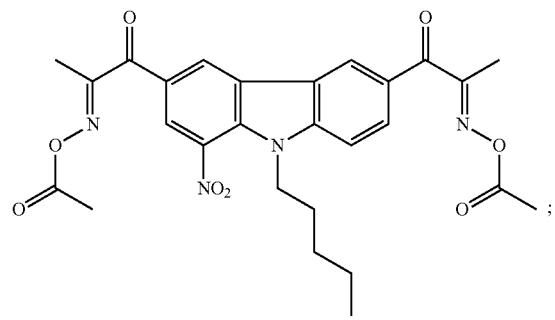
Compound No. 31
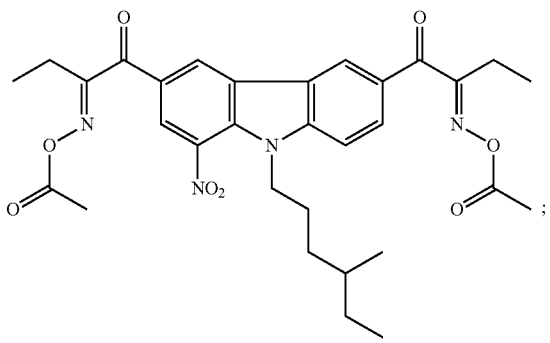
Compound No. 32
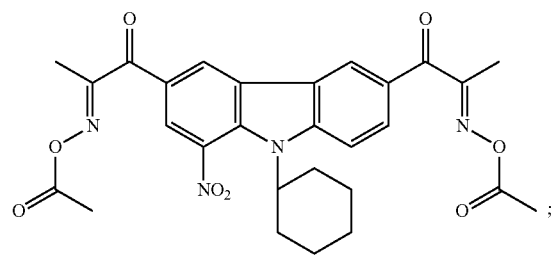
Compound No. 33
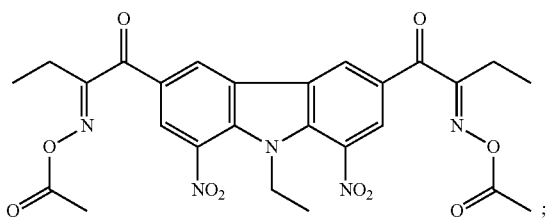
Compound No. 34
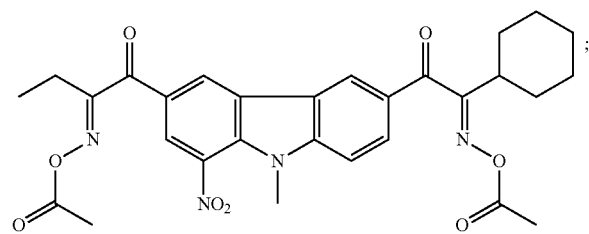
Compound No. 35
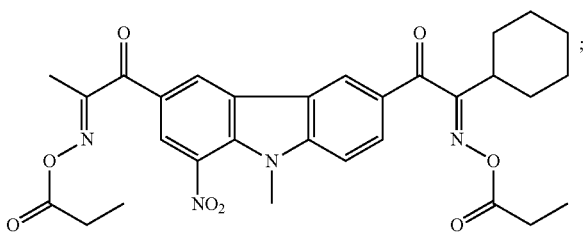
Compound No. 36
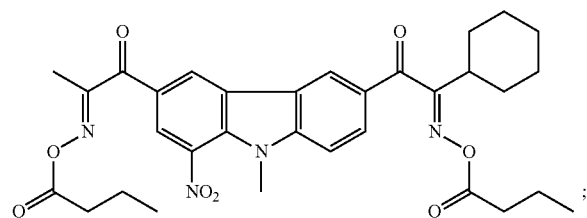
Compound No. 37
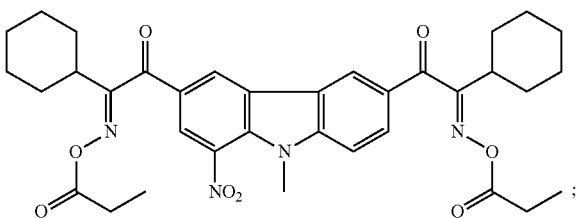
Compound No. 38
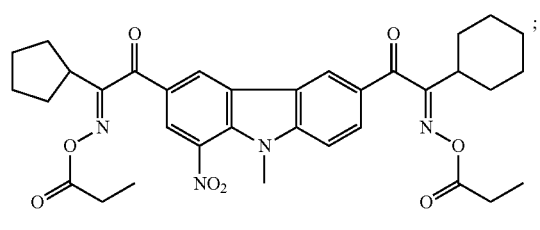
Compound No. 39
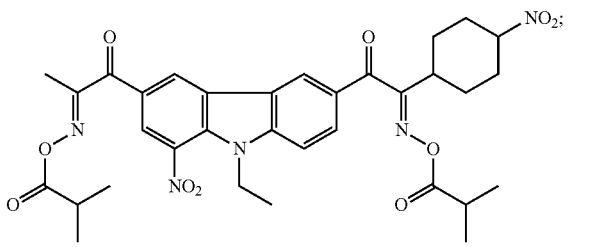

Compound No. 40
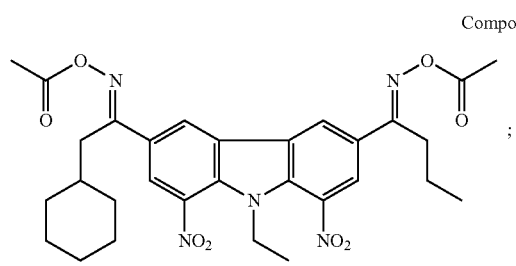
Compound No. 41
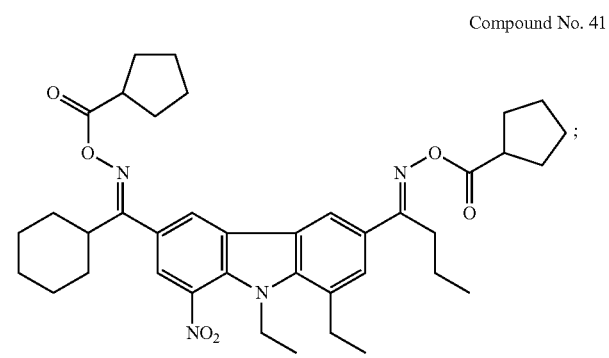
Compound No. 42
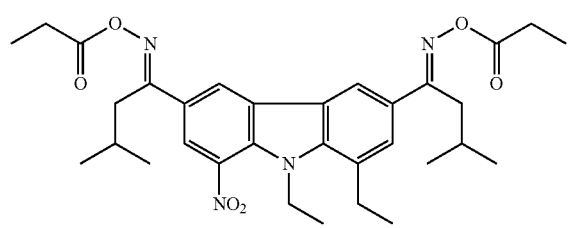
Compound No. 43
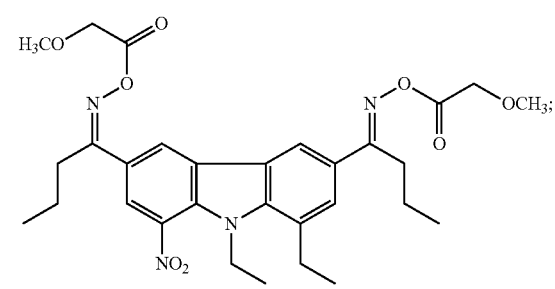
Compound No. 44
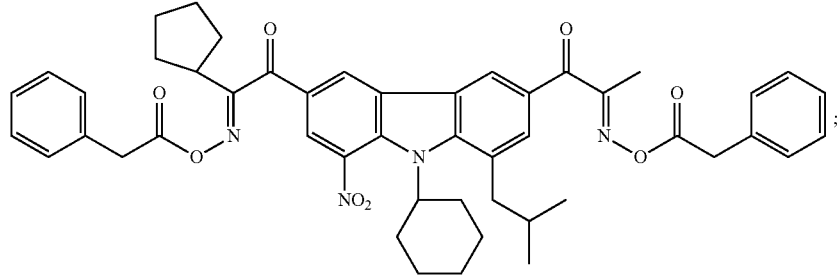
Compound No. 45
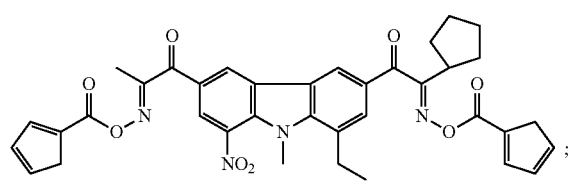
Compound No. 46
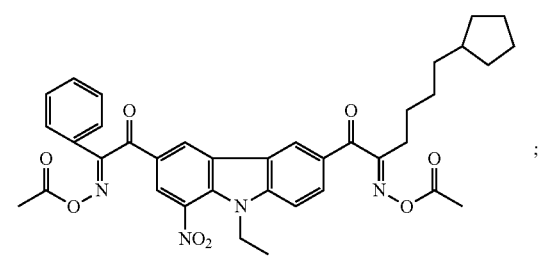
Compound No. 47
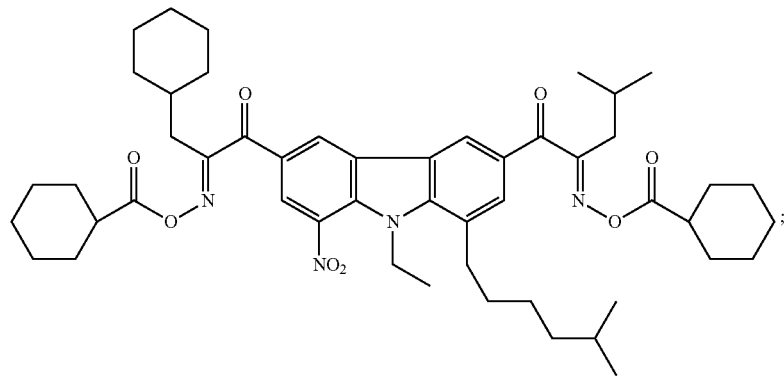

-continued
Compound No. 48
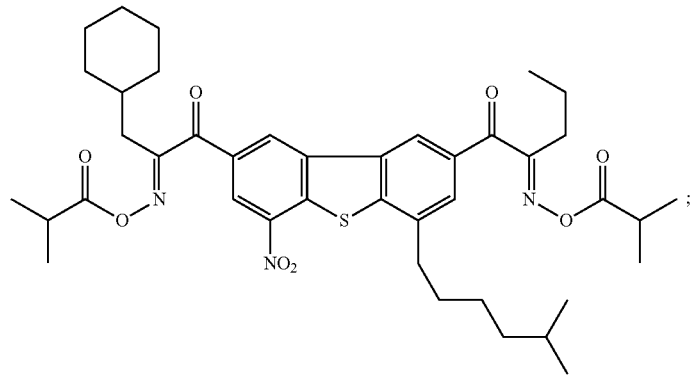
Compound No. 49
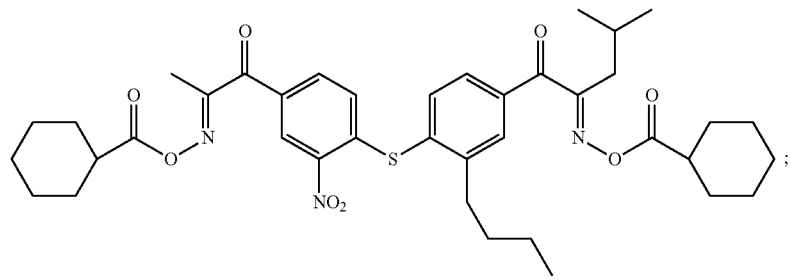
Compound No. 50
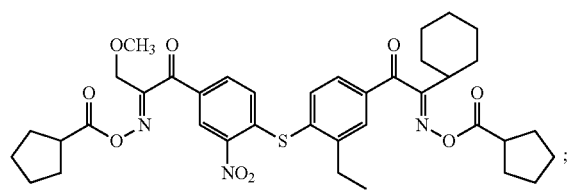
Compound No. 51
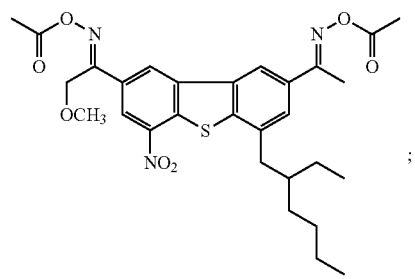
Compound No. 52
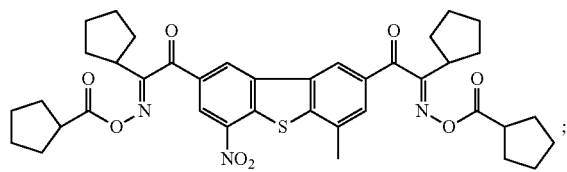
Compound No. 53
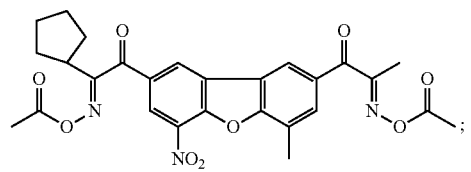
Compound No. 54
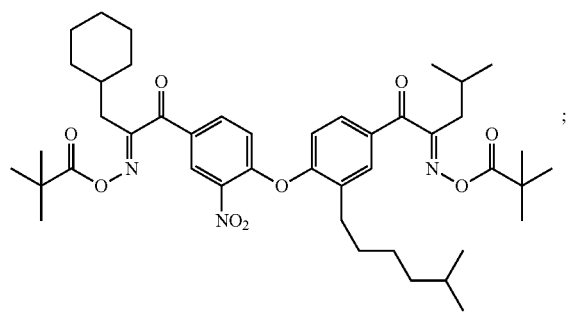
Compound No. 55
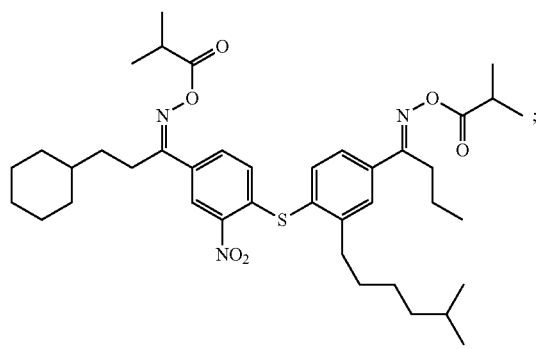

Compound No. 56
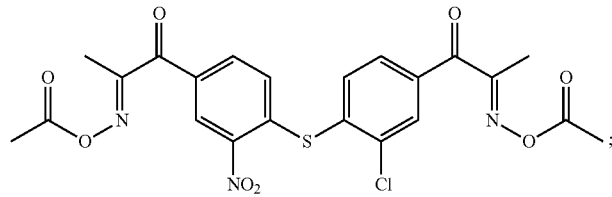
Compound No. 57
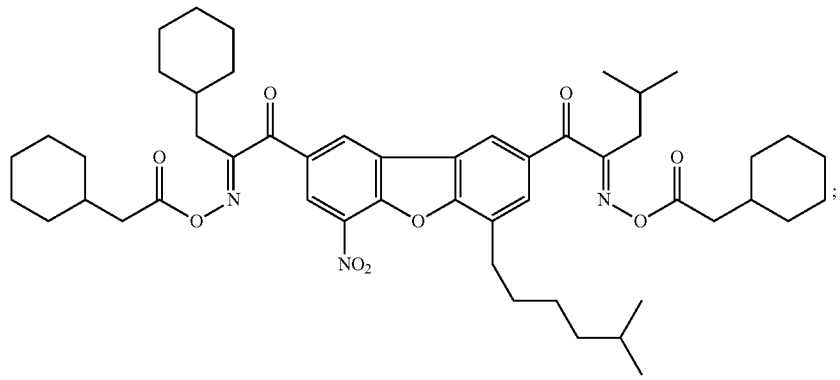
Compound No. 58
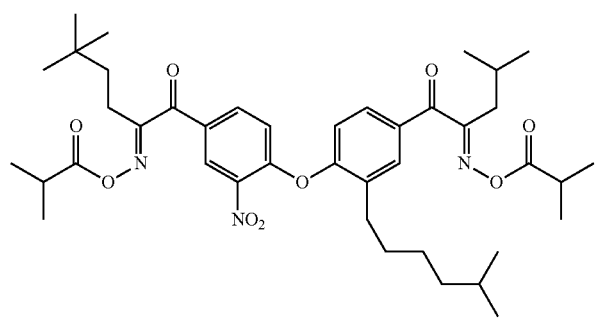
Compound No. 59
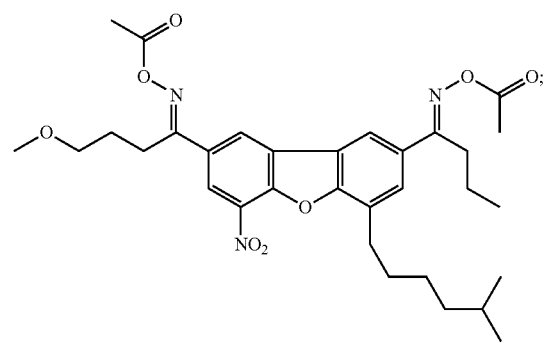
Compound No. 60
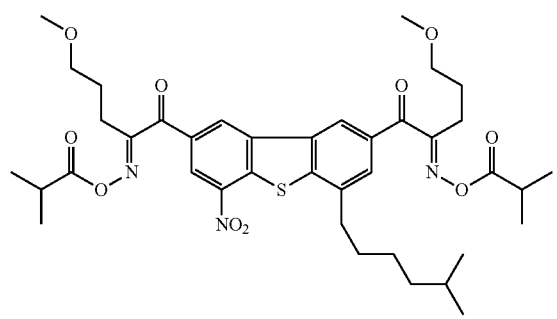
Compound No. 61
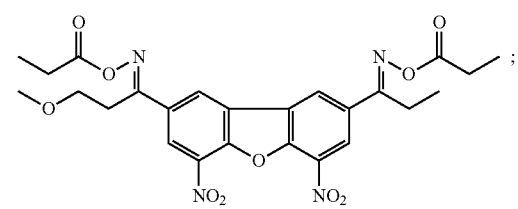
Compound No. 62
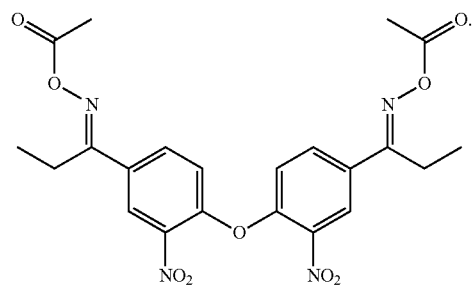

In the photosensitive composition of this invention, the ultraviolet photosensitive prepolymer resin as component (A) is not particularly limited, and a well-known conventional ultraviolet photosensitive prepolymer resin can be used. Here, resins having a vinyl unsaturated group are preferred, and more preferably, they are used in combination.

As resins having a vinyl unsaturated group, the following may be exemplified: oligomer species formed by polymerization of (meth)acrylic acid, fumaric acid, maleic acid, monomethyl fumarate, monoethyl fumarate, 2-hydroxyethyl (meth)acrylate, ethylene glycol monomethyl ether (meth) acrylate, ethylene glycol monoethyl ether (meth)acrylate, glycerol (meth)acrylate, (meth)acrylamide, acrylonitrile, methacrylonitrile, methyl (meth)acrylate, ethyl (meth)acrylate, is obutyl (meth)acrylate, 2-ethylhexyl (meth)acrylate, benzyl (meth)acrylate, ethylene glycol di(meth)acrylate, diethylene glycol di(meth)acrylate, triethylene glycol di(meth)acrylate, tetraethylene glycol di(meth)acrylate, butylene glycol di(meth)acrylate, propylene glycol di(meth)acrylate, trimethylolpropane tri(meth)acrylate, tetramethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, 1,6-ethylene glycol di(meth)acrylate, cardo epoxy diacrylate, etc.; polyester (meth)acrylates obtained by the reaction between (meth)acrylic acid and a polyester prepolymer obtained by the condensation of a polyol and a monoacid or a polyacid; polyurethane (meth)acrylates obtained by the reaction of a polyol with a compound having 2 isocyanate groups and then with (meth)acrylic acid; epoxy (meth)acrylate resins, etc., obtained by the reaction between (meth)acrylic acid and an epoxy resin, such as bisphenol A type epoxy resins, bisphenol F type epoxy resins, bisphenol S type epoxy resins, linear phenolic epoxy resins of phenol or cresol, soluble meltable phenolic epoxy resins, triphenol methane type epoxy resins, polycarboxylic acid polyglycidyl esters, polyol polyglycidyl esters, aliphatic or alicyclic epoxy resins, amine epoxy resins, dihydroxybenzene type epoxy resins, etc. Further, among epoxy (meth)acrylate resins, it is suitable to use resins subjected to polyacid anhydride reaction.

The active diluent monomer as component (B) is not particularly limited, and a well-known conventional active diluent monomer can be used. Here, monomers having a vinyl unsaturated group are preferred, and more preferably, they are used in combination. The monomers having a vinyl unsaturated group include monofunctional monomers and polyfuctional monomers.

As monofunctional monomers, the following may be exemplified: (meth)acrylamide, hydroxymethyl (meth)acrylamide, methoxymethyl (meth)acrylamide, ethoxymethyl (meth)acrylamide, propoxymethyl (meth)acrylamide, butoxymethoxymethyl (meth)acrylamide, N-hydroxymethyl (meth)acrylamide, N-hydroxymethyl (meth)acrylamide, (meth)acrylic acidfumaric acid, maleic acid, maleic anhydride, itaconic acid, itaconic anhydride, citraconic acid, citraconic anhydride, crotonic acid, 2-acrylamide-2-methylpropanesulfonic acid, tert-butyl acrylamide sulfonic acid, methyl (meth)acrylate, ethyl (meth)acrylate, butyl (meth) acrylate, 2-ethylhexyl (meth)acrylate, cyclohexyl (meth) acrylate, 2-hydroxyethyl (meth)acrylate, 2-hydroxypropyl (meth)acrylate, 2-hydroxybutyl(meth)acrylate, 2-phenoxy-2-hydroxypropyl (meth)acrylate, 2-(meth)acryloyloxy-2-hydroxypropylphthalate, glycerin mono(meth)acrylate, tetrahydrofurfuryl (meth)acrylate, dimethylamino (meth) acrylate, glycidyl (meth)acrylate, 2,2,2-trifluoroethyl (meth) acrylate, 2,2,3,3-tetrafluoropropyl (meth)acrylate, semi (meth)acrylates of phthalic acid derivatives, etc. These monofunctional monomers may be used alone, or 2 or more kinds may be used in combination.

As polyfuctional monomers, the following may be exemplified: ethylene glycol di(meth)acrylate, diethylene glycol di(meth)acrylate, tetraethylene glycol di(meth)acrylate, propylene glycol di(meth)acrylate, polypropylene glycol di(meth)acrylate, butylene glycol di(meth)acrylate, neopentyl glycol di(meth)acrylate, 1,6-hexanediol di(meth)acrylate, trimethylolpropane tri(meth)acrylate, glycerol di(meth)acrylate, pentaerythritol triacrylate, pentaerythritol tetraacrylate, dipentaerythritol pentaacrylate, dipentaerythritol hexaacrylate, pentaerythritol di(meth)acrylate, pentaerythritol tri (meth)acrylate, pentaerythritol tetra(meth)acrylate, dipentaerythritol penta(meth)acrylate, dipentaerythritol hexa (meth)acrylate, 2,2-bis(4-(meth)acryloyloxy diethoxyphenyl)propane, 2,2-bis(4-(meth)acryloyloxy polyethoxyphenyl)propane, 2-hydroxy-3-(meth) acryloyloxy propyl(meth)acrylate, ethylene glycol diglycidyl ether di(meth)acrylate, diethylene glycol diglycidyl ether di(meth)acrylate, diglycidyl phthalate di(meth)acrylate, glycerol triacrylate, glycerol polyglycidyl ether poly(meth)acrylate, urethane (meth)acrylate (i.e., benzylidene diisocyanate), the reaction product of trimethyl hexamethylene diisocyanate, hexamethylene diisocyanate, and 2-hydroxyethyl (meth) acrylate, methylene bis(meth)acrylamide, (meth)acrylamide methylene ether, the condensate of a polyol and N-hydroxymethyl (meth)acrylamide, and other polyfuctional monomers, as well as triacryl formal, etc. These polyfuctional monomers may be used alone, or 2 or more kinds may be used in combination.

In the photosensitive composition of this invention described above, the oxime ester compound (i.e., component C) described above may be merely used as a photopolymerization initiator, or other types of photopolymerization initiators may be further added. For example, the photopolymerization initiator, which may be further added, may be selected from the following compounds:

halomethylated triazine derivatives, for example 2-(4-methoxyphenyl)-4,6-bis(trichloromethyl)-s-triazine, 2-(4-methoxynaphthyl)-4,6-bis(trichloromethyl)-s-triazine, 2-(4-ethoxynaphthyl)-4,6-bis(trichloromethyl)-s-triazine, or 2-(4-ethoxycarbonylnaphthyl)-4,6-bis(trichloromethyl)-s-triazine; halomethylated oxadiazole derivatives, for example 2-trichloromethyl-5-(2'-benzofuranyl)-1,3,4-oxadiazole, 2-trichloromethyl-5-[β-(2'-benzofuranyl)ethylenyl]-1,3,4-oxadiazole, 2-trichloromethyl-5-[β-(2'-(6"-benzofuranyl)ethylenyl]-1,3,4-oxadiazole, or 2-trichloromethyl-5-furanyl-1,3,4-oxadiazole; imidazole derivatives, for example 2-(2'-chlorophenyl)-4,5-diphenylimidazole monomer, 2-(2'-chlorophenyl)-4,5-bis(3'-methoxyphenyl)imidazole dimer, 2-(2'-fluorophenyl)-4,5-diphenylimidazole dimer, 2-(2'-methoxyphenyl)-4,5-diphenylimidazole dimer, or (4'-methoxyphenyl)-4,5-diphenylimidazole dimer; benzoin alkyl ether, for example benzoin methyl ether, benzoin phenyl ether, benzoin isobutyl ether, or benzoin isopropyl ether; anthraquinone derivatives, for example 2-methylanthraquinone, 2-ethylanthraquinone, 2-tert-butylanthraquinone, or 1-chloroanthraquinone; benzanthrone derivatives; benzophenone derivatives, for example benzophenone, Michler's ketone, 2-methylbenzophenone, 3-methylbenzophenone, 4-methylbenzophenone, 2-chlorobenzophenone, 4-bromobenzophenone, or 2-carboxylbenzophenone; acetophenone derivatives, for example 2,2-dimethoxy-2-phenylacetophenone, 2,2-diethoxyacetophenone, 1-hydroxycyclohexylphenylketone, α-hydroxy-2-methylphenylacetone, 1-hydroxy-1-methylethyl-(p-isopropylphenyl)ketone, 1-hydroxy-1-(p-dodecylphenyl)ketone, 2-methyl-(4'-(methylthio) phenyl)-2-morpholino-1-acetone, or 1,1,1-trichloromethyl-(p-butylphenyl)ketone; thioxantone derivatives, for example thioxantone, 2-ethylthioxantone, 2-isopropylthioxantone, 2-chlorothioxantone, 2,4-dimetylthioxantone, 2,4-dietylthioxantone, or 2,4-diisopropylthioxantone; benzoic acid ester derivatives, for example ethyl p-dimethylaminobenzoate or ethyl p-diethylaminobenzoate; acridine derivatives, for example 9-phenylacridine or 9-(p-methoxyphenyl) acridine; phenazine derivatives, for example 9,10-dimethylbenzophenazine; or titanocene derivatives, for example dichloro titanocene, diphenyl titanocene, di(2,3,4,5,6-pentafluorophen-1-yl)titanocene, di(2,3,5,6-tetrafluorophen-1-yl)titanocene, di(2,4,6-trifluorophen-1-yl)titanocene, 2,6-difluorophen-1-yl titanocene, 2,4-difluorophen-1-yl titanocene, di(2,3,4,5,6-pentafluorophen-1-yl)dimethyl cyclopentadienyl titanium, di(2,6-difluorophen-1-yl)dimethyl cyclopentadienyl titanium, or 2,6-difluoro-3-(pyrrol-1-yl)-phen-1-yl titanocene.

In addition to components (A)-(C) described above, various additives may be further added to the photosensitive composition of this invention as needed, which include, but are not limited to, a colorant, a solvent, a sensitizer, a curing accelerator, a photo-crosslinking agent, a photosensitizer, a dispersion auxiliary agent, a filler, an adhesion promoter, an antioxidant, an ultraviolet absorbent, an anti-flocculating agent, a thermal polymerization inhibitor, a defoaming agent, a surfactant, etc.

As a colorant which may be contained in the photosensitive composition of this invention, it is no particularly limited. However, it is preferred to use compounds which are classified as pigments in color index (C.I.; published by The Society of Dyers and Colourists), and colorants having the following color index (C.I.) numbers may be particularly used:

C.I. Pigment Yellow 1 (since C.I. Pigment Yellow is identical below, only the number is recorded for the purpose of simplification of drafting), 3, 11, 12, 13, 14, 15, 16, 17, 20, 24, 31, 53, 55, 60, 61, 65, 71, 73, 74, 81, 83, 86, 93, 95, 97, 98, 99, 100, 101, 104, 106, 108, 109, 110, 113, 114, 116, 117, 119, 120, 125, 126, 127, 128, 129, 137, 138, 139, 147, 148, 150, 151, 152, 153, 154, 155, 156, 166, 167, 168, 175, 180, 185;

C.I. Pigment Orange 1 (since C.I. Pigment Orange is identical below, only the number is recorded for the purpose of simplification of drafting), 5, 13, 14, 16, 17, 24, 34, 36, 38, 40, 43, 46, 49, 51, 55, 59, 61, 63, 64, 71, 73;

C.I. Pigment Violet 1 (since C.I. Pigment Violet is identical below, only the number is recorded for the purpose of simplification of drafting), 19, 23, 29, 30, 32, 36, 37, 38, 39, 40, 50;

C.I. Pigment Red 1 (since C.I. Pigment Red is identical below, only the number is recorded for the purpose of simplification of drafting), 2, 3, 4, 5, 6, 7, 8, 9, 10, 11, 12, 14, 15, 16, 17, 18, 19, 21 and 22, 23, 30, 31, 32, 37, 38, 40, 41 and 42, 48:1, 48:2, 48:3, 48:4, 49:1, 49:2, 50:1, 52:1, 53:1, 57, 57:1, 57:2, 58:2, 58:4, 60:1, 63:1, 63:2, 64:1, 81:1, 83, 88, 90:1, 97, 101, 102, 104, 105, 106, 108, 112, 113, 114, 122, 123, 144, 146, 149, 150, 151, 155, 166, 168, 170, 171, 172, 174, 175, 176, 177, 178, 179, 180, 185, 187, 188, 190, 192, 193, 194, 202, 206, 207, 208, 209, 215, 216, 217, 220, 223, 224, 226, 227, 228, 240, 242, 243, 245, 254, 255, 264, 265;

C.I. Pigment Blue 1 (since C.I. Pigment Blue is identical below, only the number is recorded for the purpose of simplification of drafting), 2, 15, 15:3, 15:4, 15:6, 16, 22, 60, 64, 66;

C.I. Pigment Green 7, C.I. Pigment Green 36, C.I. Pigment Green 37;

C.I. Pigment Brown 23, C.I. Pigment Brown 25, C.I. Pigment Brown 26, C.I. Pigment Brown 28;

and C.I. Pigment Black 1, C.I. Pigment Black 7.

Furthermore, as inorganic pigments, the following may be exemplified, for example, titanium oxide, barium sulfate, calcium carbonate, zinc white, lead sulfate, massicot (yellow), zinc yellow, iron oxide red, cadmium red, ultramarine, Prussian blue, chromium oxide green, cobalt green, amber, titanium black, synthetic iron black, carbon black, etc.

In this invention, the organic pigments and the inorganic pigments described above may be used alone respectively, may be used by mixing 2 or more kinds thereof, or the organic pigments and the inorganic pigments may be used in combination.

In the case that the colorant is used as a light-shielding agent, a black pigment is preferably used as the light-shielding agent. As a black pigment, either an organic pigment or an inorganic pigment may be used, and the following may be exemplified: carbon black, titanium black (titan black), and metal oxides, complex oxides, metal sulfides, metal sulfates, or metal carbonates of copper, iron, manganese, cobalt, chromium, nickel, zinc, calcium, silver, etc. Among these black pigments, carbon black having a high light-shielding property is preferably used. Furthermore, in order to adjust the color tone of carbon black, the organic pigment described above may be suitably added as an auxiliary pigment.

In order to uniformly disperse the colorant described above in the photosensitive composition, a dispersant may be further used. As this dispersant, a polymer dispersant, such as polyethyleneimine dispersant, polyurethane resin dispersant, and acrylic resin dispersant, are preferably used. Particularly, in the case that carbon black is used as the colorant, the acrylic resin dispersant is preferably used as a dispersant.

As the solvent used in the photosensitive composition of this invention, the following may be exemplified: (poly) alkylene glycol monoalkyl ethers, such as ethylene glycol monomethyl ether, ethylene glycol monoethyl ether, ethylene glycol n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether, etc.; (poly)alkylene glycol monoalkyl ether acetates, such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate, propylene glycol monoethyl ether acetate, etc.; other ethers, such as diethylene glycol dimethyl ether, diethylene glycol methyl ethyl ether, diethylene glycol diethyl ether, tetrahydrofuran, etc.; ketones, such as butanone, cyclohexanone, 2-heptanone, 3-heptanone, etc.; alkyl lactates, such as methyl-2-hydroxy propionate, ethyl-2-hydroxy propionate, etc.; other esters, such as ethyl 2-hydroxy-2-methylpropionate, methyl 3-methoxypropionate, ethyl 3-methoxy propionate, methyl 3-ethoxypropionate, ethyl 3-ethoxypropionate, ethyl ethoxyacetate, ethyl hydroxyacetate, methyl 2-hydroxy-3-methylbutyrate, 3-methyl-3-methoxy butyl acetate, 3-methyl-3-methoxy butyl propionate, ethyl acetate, n-propyl acetate, isopropyl acetate, n-butyl acetate, isobutyl acetate, n-pentyl formate, isopentyl acetate, n-butyl propionate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate, ethyl 2-acetoacetate, etc.; aromatic hydrocarbons, such as toluene, xylene, etc.; amides, such as N-methylpyrrolidone, N,N-dimethylformamide, N,N-dimethylacetamide, etc.; and the like. These solvents may be used alone, or 2 or more kinds may be used in combination.

As the thermal polymerization inhibitor used in the photosensitive composition of this invention, for example, hydroquinone, hydroquinone monoethyl ether, etc., may be exemplified.

As the defoaming agent, polysiloxane compounds, fluorine compounds, etc., may be used.

As the surfactant, anionic surfactants, cationic surfactants, and nonionic surfactants may be used.

Another object of this invention is to provide use of the above photosensitive composition containing an oxime ester photoinitiator in a liquid crystal display apparatus, such as color filters (RGB and BM photoresists), photospacers, or ribs.

Still another object of this invention is to provide a photoresist film, a color filter film, a photospacer, and a rib prepared from the above photosensitive composition containing an oxime ester photoinitiator.

Techniques for preparing photoresist films, color filter films, photospacers, etc., using photosensitive compositions by the processes of photocuring and lithography have been well known by the skilled person in the art, and typically comprise the steps of:

i) uniformly mixing respective components to form a photosensitive composition;

ii) coating the photosensitive composition on a substrate;

for example, coating the photosensitive composition on a substrate by using a contact transfer type coating apparatus (such as a roll coater, a reverse coater, a rod coater, etc.) or rotor (such as a rotary coating apparatus) and a non-contact type coating apparatus (such as a curtain type flowing coater).

iii) drying the photosensitive composition coated on the substrate to form a coating film;

wherein the drying method is not particularly limited, and for example, any one of the following methods may be used: (1) a method of drying on a hot plate at 80 to 120° C., preferably 90 to 100° C. for 60 to 120 seconds; (2) a method of placing at room temperature for several hours to several days; (3) a method of removing solvent by placing in a hot-air heater or an infrared heater for tens of minutes to several hours.

iv) irradiating this coating film with an active energy ray through a negative mask to allow it to be partly exposed;

wherein the energy ray radiated may be ultraviolet, excimer laser etc., and the intensity may be varied according to the composition of the photosensitive composition, but is preferably 30 to 2000 mJ/cm$^2$, for example;

v) developing the exposed coating film with a developer to form a pattern with a desired shape;

wherein the developing method is not particularly limited, and for example, a dipping method, a spraying method, etc., may be used; and developers, for example, organic substances such as monoethanolamine, diethanolamine, triethanolamine, etc., or aqueous solutions of sodium hydroxide, potassium hydroxide, sodium carbonate, ammonia, quaternary ammonium salt, etc., may be exemplified; and vi) performing post-baking, preferably at a baking temperature of 200° C. to 250° C.

In this invention, the oxime ester photoinitiator as component (C) has a good adaptability to components (A) and (B). By the combination of these components, the composition obtained has very good storage stability. It is not only suitable for normal light sources, but also has remarkably high sensitivity under the irradiation of LED light sources and laser light sources. It may be cross-linked and cured well at a very low exposure dose, and has an extremely good curing effect. The film made from this composition has a smooth edge, no defects and scum, and good integrity throughout the whole pattern, and is a high-hardness resist film, and an optical filter made therefrom has high optical transparency and no light leakage. In particular, when producing black matrices (BMs) in color filters, the presence of a black pigment or dye causes the utilization effect of the light source to be extremely poor, whereas the production of BMs still may be completed at a very low exposure dose by using this composition, and the BMs produced have high light-shielding property as well as excellent precision, evenness, and durability. Meanwhile, the composition of this invention is also an excellent material for producing photospacers and ribs.

DESCRIPTION OF EMBODIMENTS

Hereafter, this invention will be illustrated in further detail by specific Examples, but it should not to be understood that the scope of this invention is limited thereto.

EXAMPLES

A photosensitive composition was formulated as follows, comprising a benzyl methacrylate/methacrylic acid/hydroxyethyl methacrylate (molar ratio 70/10/20) copolymer (Mw:10000) (50 parts by mass), dipentaerythritol hexaacrylate (25 parts by mass), a photoinitiator, and a pigment.

Types and usage amounts of the photoinitiator and the pigment described above were as shown in Table 1.

TABLE 1

|  | Photoinitiator (Types, Parts by mass) | Pigment (Types, Parts by mass) |
| --- | --- | --- |
| Example 1 | Compound No. 1, 5 | Carbon black, 20 |
| Example 2 | Compound No. 12, 5 | Carbon black, 20 |
| Example 3 | Compound No. 14, 5 | Carbon black, 20 |
| Example 4 | Compound No. 24, 5 | C.I. Pigment Blue-15:3, 20 |
| Example 5 | Compound No. 31, 5 | C.I. Pigment Blue-15:3, 20 |

TABLE 1-continued

| | Photoinitiator (Types, Parts by mass) | Pigment (Types, Parts by mass) |
|---|---|---|
| Example 6 | Compound No. 48, 5 | C.I. Pigment Blue-15:3, 20 |
| Example 7 | Compound No. 49, 5 | C.I. Pigment Blue-15:3, 20 |
| Example 8 | Compound No. 54, 5 | C.I. Pigment Blue-15:3, 20 |
| Comparative Example 1 | 2-phenyl-2-dimethylamino-1-(4-morpholinophenyl)-butanone-1 (Irgacure 369), 5 | Carbon black, 20 |
| Comparative Example 2 | 1-(4-phenylthiophenyl)-(3-cyclopentyl)-1,2-dione-2-oxime-benzoate (CN101565472A), 5 | C.I. Pigment Blue-15:3, 20 |
| Comparative Example 3 | 1-(6-o-methylbenzoyl-9-ethylcarbazol-3-yl)-(3-ethanone)-1-oxime-acetate (OXE02), 5 | Carbon black, 20 |

The photosensitive composition was formulated according to the formulation shown in Table 1, and was dissolved in 100 parts by mass of a solvent propylene glycol monomethyl ether acetate (PGMEA) to form a liquid-state composition.

The liquid-state composition was coated on a glass substrate by using a spin coater, and the solvent was removed by drying at 90° C. for 5 min to form a coating film having a film thickness of 1.5 μm; and in order to obtain the coating film having the thickness described above, the coating process may be completed by one time or multiple times.

The substrate on which the coating film was formed was cooled to room temperature, a mask plate was attached thereon, and the coating film was exposed with a 395 nm LED light source.

At a temperature of 25° C., 1% aqueous NaOH solution was used for development, ultra-pure pure water was used for washing, and air drying was performed.

Finally, baking was performed in an oven at 220° C. for 30 min to obtain a pattern transferred with the mask plate.

Performance Evaluation

1. Evaluation method for storage stability

After a liquid-state composition being stored at room temperature for 1 month, the degree of precipitation of substances was visually evaluated according to the following criteria:

A: No precipitation was observed;
B: Precipitation was slightly observed;
C: Significant precipitation was observed.

2. Evaluation method for exposure sensitivity

The minimum exposure amount of the irradiated region having a residual film rate of 90% or more after development in the step of exposure was evaluated as the exposure demand A smaller exposure demand represents a higher sensitivity.

3. Evaluation method for developability and pattern integrity

The pattern on the substrate was observed using a scanning electron microscope (SEM) to evaluate the developability and the pattern integrity.

The developability was evaluated according to the following criteria:

○: No residue was observed in unexposed portions;
◉: A small amount of residue was observed in unexposed portions, but the residue is acceptable;
●: Significant residue was observed in unexposed portions.

The pattern integrity was evaluated according to the following criteria:

Δ: No pattern defects were observed;
□: A few defects were observed in some portions of the pattern;
▲: A number of defects were significantly observed in the pattern.

Evaluation results were as shown in Table 2.

TABLE 2

| | Results of performance evaluation | | | |
|---|---|---|---|---|
| | storage stability | exposure demand mJ/cm$^2$ | developability | pattern integrity |
| Example 1 | A | 50 | ○ | Δ |
| Example 2 | A | 40 | ○ | Δ |
| Example 3 | A | 40 | ○ | Δ |
| Example 4 | A | 45 | ○ | Δ |
| Example 5 | A | 45 | ○ | Δ |
| Example 6 | A | 35 | ○ | Δ |

From the results of Table 2, it can be seen that compositions of Examples 1-8 have extremely excellent storage stability in solution systems and small exposure demand, and color filter photoresists produced therefrom have good developability and pattern integrity. Each performance is superior to that of Comparative Examples 1-3.

It should be particularly noted that the exposure doses of the compositions of Examples 1-8 under the irradiation of LED dot lamp light sources are all less than 50 mJ/cm$^2$, which is far lower than those of Comparative Examples 1-3, exhibiting extremely excellent photosensitivity. This provides a good promotional effect on generalization and application of energy-saving and environment-friendly LED dot light sources in the technical field of photocuring.

In summary, the photosensitive composition containing an oxime ester photoinitiator of this invention exhibits a very excellent application performance and has a wide prospect for application.

What is claimed is:

1. A photosensitive composition containing an oxime ester photoinitiator, comprising the following components:

(A) 20-60 parts by mass of an ultraviolet photosensitive prepolymer resin;

(B) 10-30 parts by mass of an active diluent monomer; and (C) 1-5 parts by mass of an oxime ester photoinitiator;

the oxime ester photoinitiator as component (C) being at least one selected from the group consisting of bisoxime ester compounds represented by the following general formula (I):

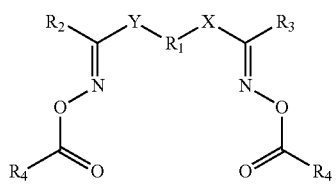

wherein,
R₁ is

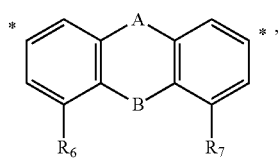

wherein * represents a binding position, A is a single bond; B is a R₅N-group, wherein R₅ is hydrogen, a $C_1$-$C_{20}$ linear or branched alkyl group, a $C_3$-$C_{20}$ cycloalkyl group, a $C_4$-$C_{20}$ cycloalkylalkyl group, or a $C_4$-$C_{20}$ alkylcycloalkyl group; R₆ and R₇ each independently represent hydrogen, halogen, a nitro group, a hydroxy group, a carboxyl group, a sulfonic acid group, an amino group, a cyano group, or an alkoxy group, or a $C_1$-$C_{20}$ linear or branched alkyl group, a $C_3$-$C_{20}$ cycloalkyl group, a $C_4$-$C_{20}$ cycloalkylalkyl group, or a $C_4$-$C_{20}$ alkylcycloalkyl group which are optionally substituted with one or more groups selected from the group consisting of halogen, a nitro group, a hydroxy group, a carboxyl group, a sulfonic acid group, an amino group, a cyano group, and an alkoxy group;

X and Y each represent a carbonyl (—CO—);

R₂ and R₃ each independently represent hydrogen, a $C_1$-$C_{20}$ linear or branched alkyl group, a $C_3$-$C_{20}$ cycloalkyl group, a $C_4$-$C_{20}$ cycloalkylalkyl group, a $C_4$-$C_{20}$ alkylcycloalkyl group, or a $C_7$-$C_{20}$ aralkyl group, and optionally, one or more hydrogens in the above groups may be each independently substituted with a group selected from the group consisting of halogen, a nitro group, a hydroxy group, a carboxyl group, a sulfonic acid group, an amino group, a cyano group, and an alkoxy group;

R₄ independently represents a $C_1$-$C_{20}$ linear or branched alkyl group, a $C_3$-$C_{20}$ cycloalkyl group, a $C_4$-$C_{20}$ cycloalkylalkyl group, a $C_4$-$C_{20}$ alkylcycloalkyl group, a $C_3$-$C_{20}$ heteroaryl group, or a $C_6$-$C_{20}$ aryl group, and optionally, one or more hydrogens in the above groups may be each independently substituted with a group selected from the group consisting of halogen, a phenyl group, a nitro group, a hydroxy group, a carboxyl group, a sulfonic acid group, an amino group, a cyano group, and an alkoxy group.

2. The photosensitive composition of claim 1, wherein the oxime ester photoinitiator as component (C) is one or a combination of two or more selected from the following compounds:

Compound No. 11

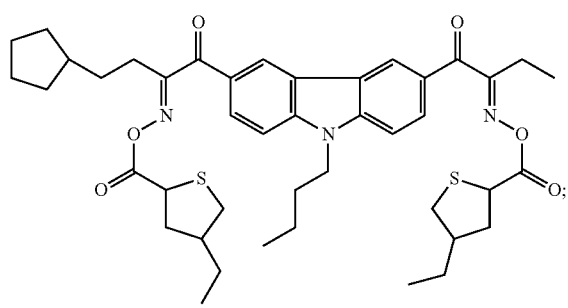

Compound No. 12

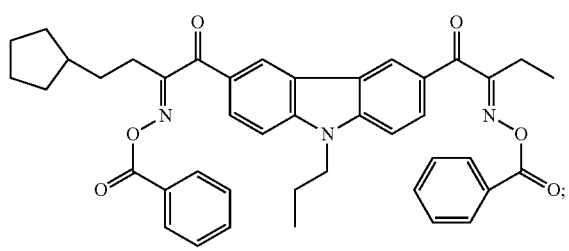

Compound No. 13

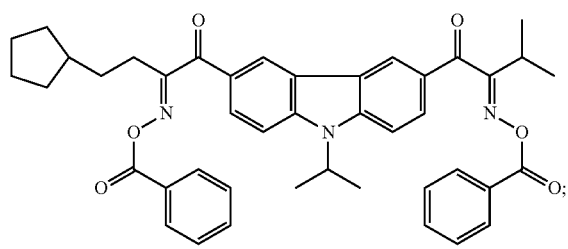

Compound No. 15

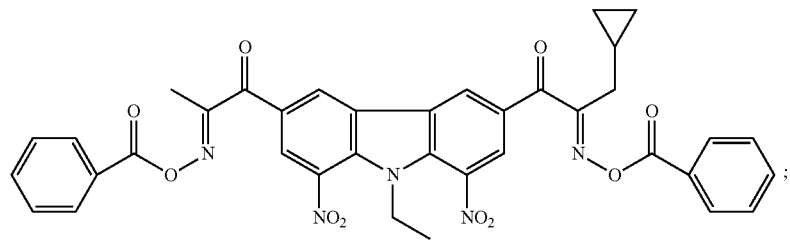

-continued
Compound No. 16
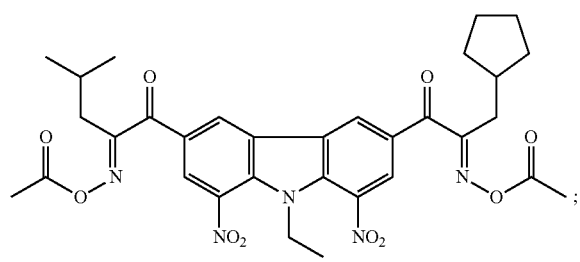
Compound No. 17
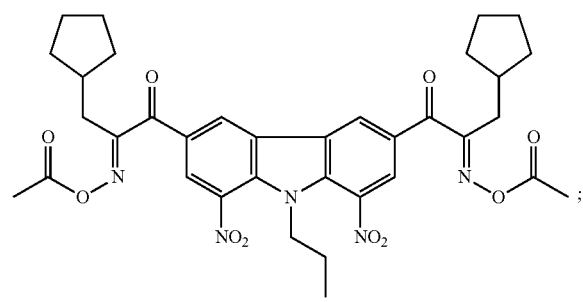
Compound No. 19
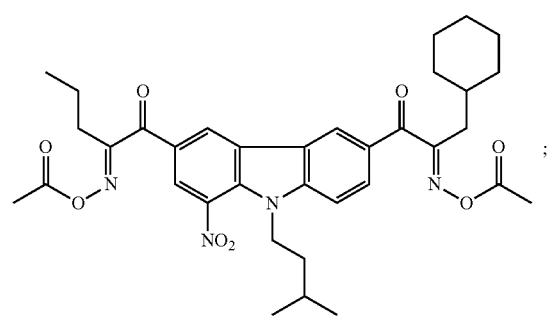
Compound No. 20
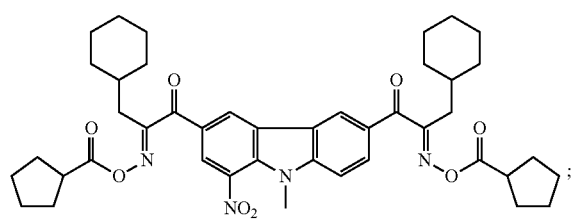
Compound No. 21
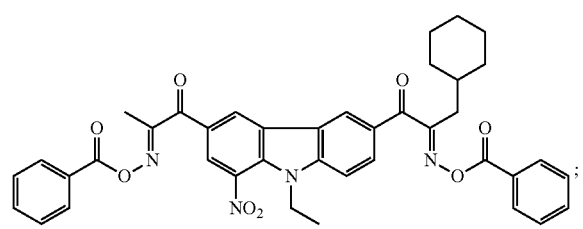
Compound No. 22
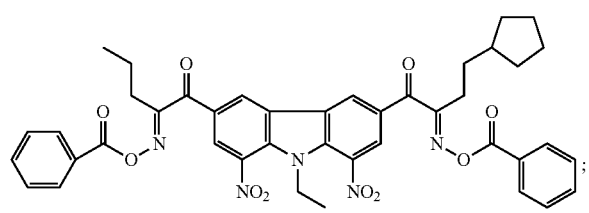
Compound No. 23
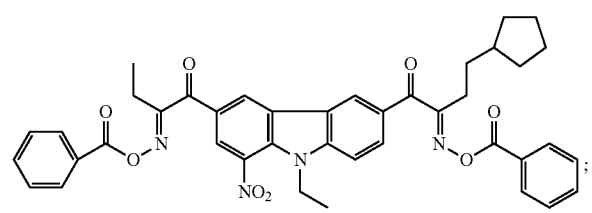
Compound No. 29
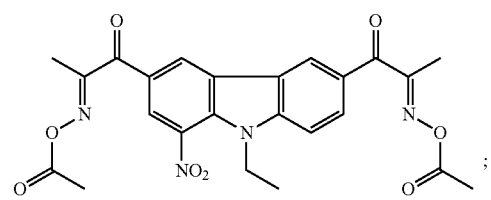

-continued
Compound No. 30
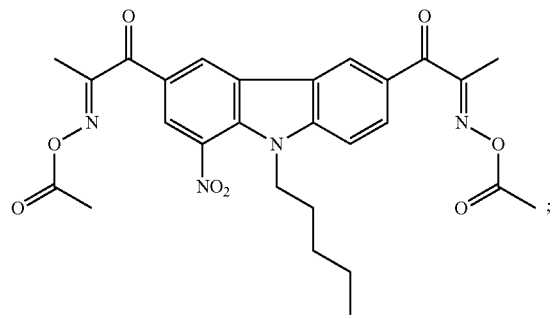
Compound No. 31
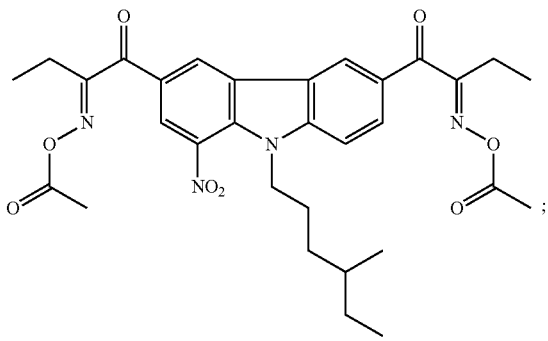
Compound No. 32
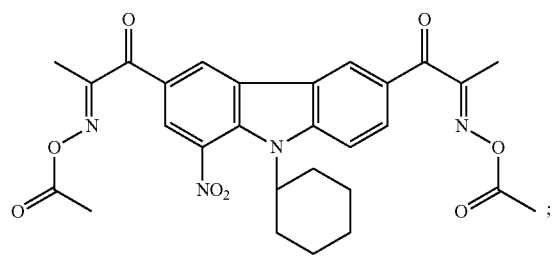
Compound No. 33
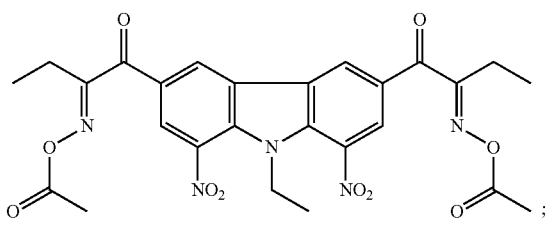
Compound No. 34
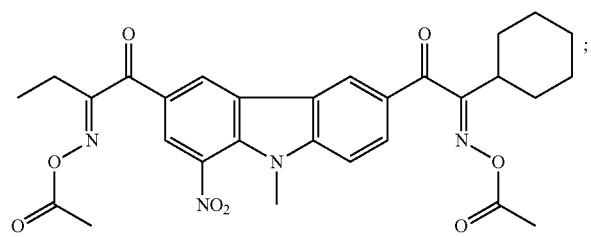
Compound No. 35
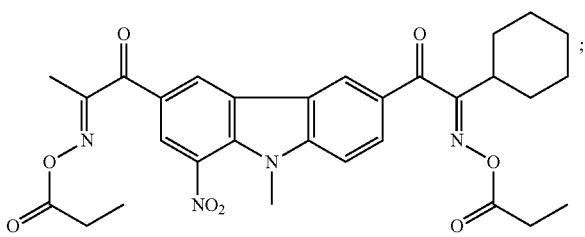
Compound No. 36
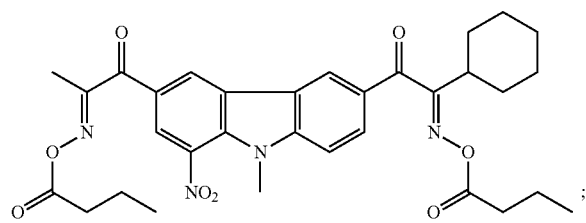
Compound No. 37
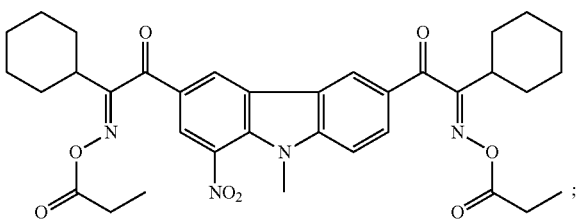
Compound No. 38
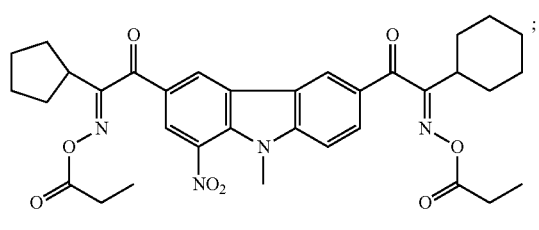
Compound No. 39
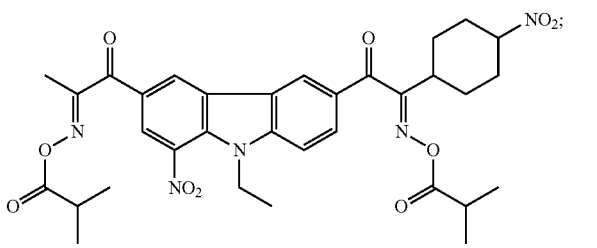

Compound No. 44
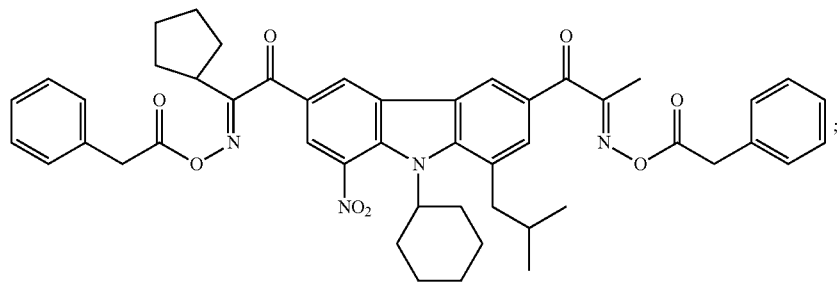
Compound No. 45
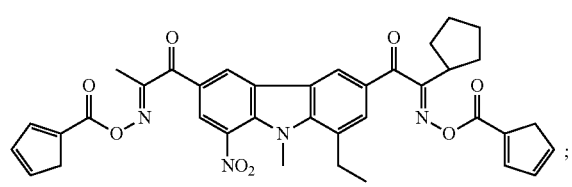
Compound No. 46
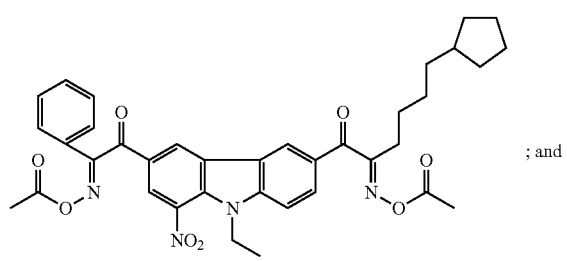
; and
Compound No. 47
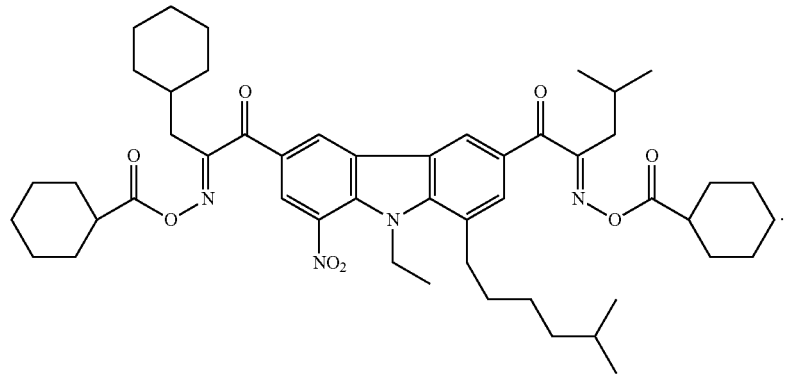

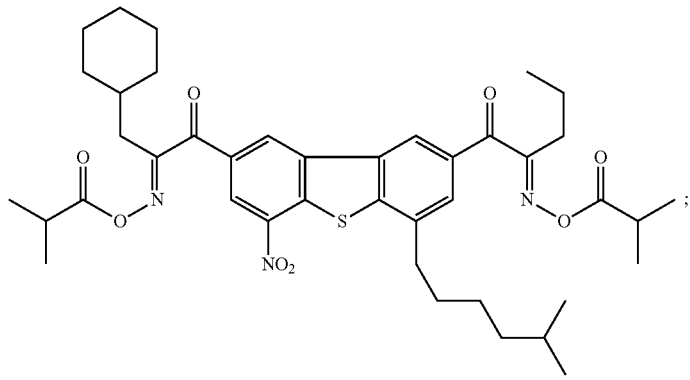

Compound No. 48

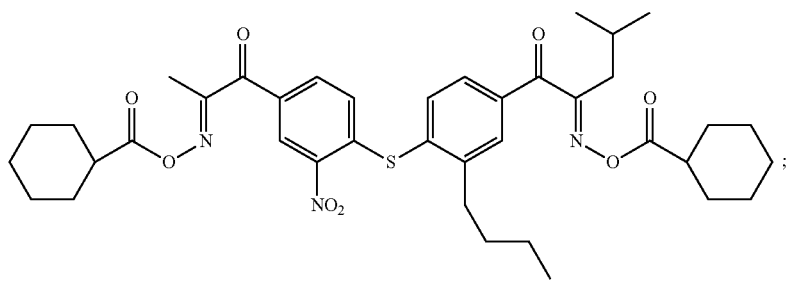

Compound No. 49

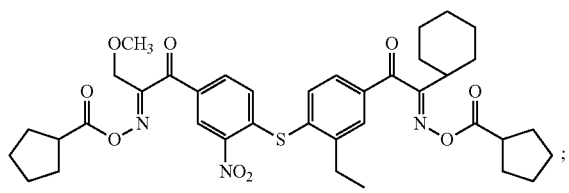

Compound No. 50

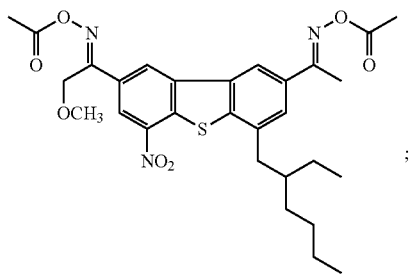

Compound No. 51

3. The photosensitive composition of claim 1, wherein the ultraviolet photosensitive prepolymer resin as component (A) is selected from resins having a vinyl unsaturated group.

4. The photosensitive composition of claim 1, wherein the active diluent monomer as component (B) is selected from monomers having a vinyl unsaturated group.

5. The photosensitive composition of claim 1, further comprising an additional photopolymerization initiator of another type.

6. The photosensitive composition of claim 1, further comprising at least one of a colorant, a solvent, a sensitizer, a curing accelerator, a photo-crosslinking agent, a photosensitizer, a dispersion auxiliary agent, a filler, an adhesion promoter, an antioxidant, an ultraviolet absorbent, an anti-flocculating agent, a thermal polymerization inhibitor, a defoaming agent, and a surfactant.

7. A liquid crystal display apparatus, comprising a film prepared from the photosensitive composition of claim 1.

8. A photoresist film prepared from the photosensitive composition of claim 1.

9. A color filter film prepared from the photosensitive composition of claim 1.

10. A photospacer prepared from the photosensitive composition of claim 1.

11. A rib prepared from the photosensitive composition of claim 1.

12. A photosensitive composition containing an oxime ester photoinitiator, comprising the following components:
   (A) 20-60 parts by mass of an ultraviolet photosensitive prepolymer resin;
   (B) 10-30 parts by mass of an active diluent monomer; and
   (C) 1-5 parts by mass of an oxime ester photoinitiator,
   wherein the oxime ester photoinitiator as component (C) is one or a combination of two or more selected from the following compounds:

Compound No. 14

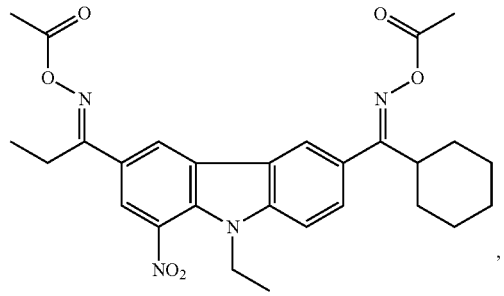

Compound No. 18
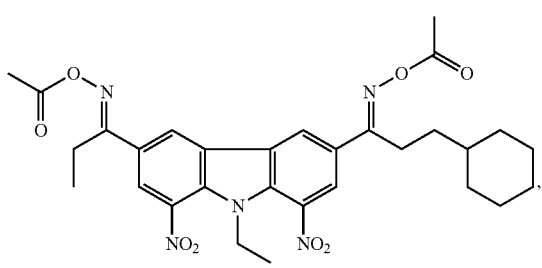
Compound No. 42
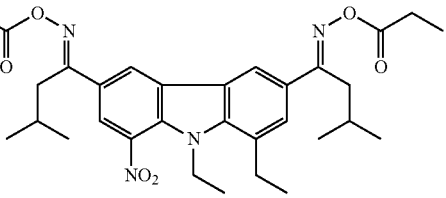
, and
Compound No. 40
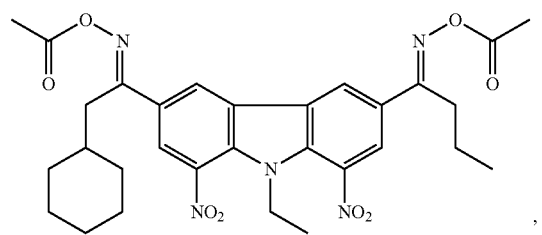
Compound No. 41
Compound No. 43
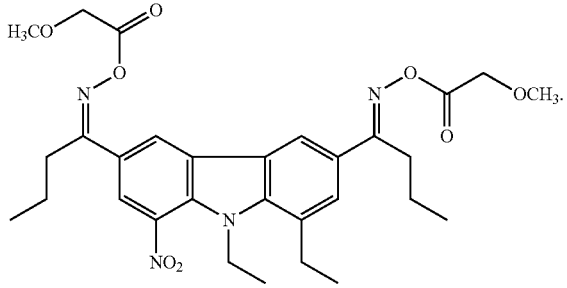
* * * * *